(12) United States Patent
Akamatsu et al.

(10) Patent No.: US 6,304,503 B1
(45) Date of Patent: *Oct. 16, 2001

(54) SEMICONDUCTOR MEMORY DEVICE

(75) Inventors: Hiroshi Akamatsu; Masanori Hayashikoshi, both of Hyogo (JP)

(73) Assignee: Mitsubishi Denki Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/238,916

(22) Filed: Jan. 28, 1999

Related U.S. Application Data

(63) Continuation of application No. PCT/JP96/02137, filed on Jul. 29, 1996.

(51) Int. Cl.[7] ....................................................... G11C 7/00
(52) U.S. Cl. ........................................ 365/201; 365/189.05
(58) Field of Search ............................... 365/189.05, 201, 365/189.09, 226

(56) References Cited

U.S. PATENT DOCUMENTS

| 4,852,061 | * | 7/1989 | Baron ................................ 365/201 |
| 5,377,144 | * | 12/1994 | Brown ............................... 365/201 |
| 5,383,157 | * | 1/1995 | Phelan .............................. 365/201 |
| 5,592,422 | * | 1/1997 | McClure ............................ 365/201 |
| 5,654,924 | * | 8/1997 | Suzuki .............................. 365/201 |

FOREIGN PATENT DOCUMENTS

| 0 558-231 A2 | 9/1993 | (EP) . |
| 63-191400 | 8/1988 | (JP) . |
| 2-203286 | 8/1990 | (JP) . |
| 5-174599 | 7/1993 | (JP) . |
| 5-250872 | 9/1993 | (JP) . |
| 6-28853 | 2/1994 | (JP) . |

* cited by examiner

*Primary Examiner*—A. Zarabian
(74) *Attorney, Agent, or Firm*—McDermott, Will & Emery

(57) ABSTRACT

The semiconductor memory device in accordance with the present invention allows evaluation of input/output terminal dependency of noise characteristic at the time of data output, it has a normal operation mode and a test mode, and includes a plurality of output at buffers and selecting means for selectively activating at least one output buffer among the plurality of output buffers in the test mode.

4 Claims, 11 Drawing Sheets

SEMICONDUCTOR MEMORY DEVICE

CROSS-REFERENCE TO RELATED APPLICATIONS

This application is a continuation of International Application No. PCT/JP96/02137, whose international filing date is Jul. 29, 1996, the disclosures of which Application are incorporated by reference herein. The benefit of the filing and priority dates of the International Application is respectfully.

BACKGROUND OF THE INVENTION

1. Field of the Invention

The present invention relates to a semiconductor memory device and, more particularly, to a semiconductor memory device having a circuit for evaluating noise characteristic at the time of data output.

2. Description of the Background Art

FIG. 11 shows circuit configuration of output buffers 11, 13 and 15 of a conventional semiconductor memory device, and FIG. 12 shows a concept of a pattern layout of the output buffers.

As shown in FIG. 11, the output buffer is activated when an output control signal φ activated and at a high (H) level is input to NAND circuits 4 and 6.

In a semiconductor memory device having a plurality of input/output terminals 2 such as shown in FIG. 12, all output buffers are activated in normal operation, and data is output from every input/output terminal 2.

Here, N channel MOS transistors TN1 included in respective output buffers 11, 13 and 15 are connected together to one $V_{CC}$ line 1 as shown in FIG. 12, and therefore in a so-called multi-bit product having a large number of input/output terminals 2, there is a problem of considerable noise generated at the power supply voltage $V_{CC}$ at the time of data output. Therefore, it is necessary to minimize the influence of noise. In that case, what input/output terminal is susceptible to noise generation at the time of data output must be inspected. In the conventional semiconductor memory device, however, there is not any circuit provided for inspecting output terminal dependency of noise at the time of data output.

SUMMARY OF THE INVENTION

An object of the present invention is to provide a semiconductor memory device which is capable of evaluating noise characteristic generated at the time of data output.

The object of the present invention is attained by providing a semiconductor memory device having a normal operation mode and a test mode, including a plurality of output buffers and selecting means for selecting and activating at least one output buffer of said plurality of output buffers in response to an external signal in the test mode.

A main advantage of the present invention is that it is possible to evaluate input/output terminal dependency of the noise generated at the time of data output, as an output buffer is selectively activated among a plurality output buffers in the test mode.

The foregoing and other objects, features, aspects and advantages of the present invention will become more apparent, from the following detailed description of the present invention when taken in conjunction with the accompanying drawings.

DESCRIPTION OF THE PREFERRED EMBODIMENTS

Figure 1:
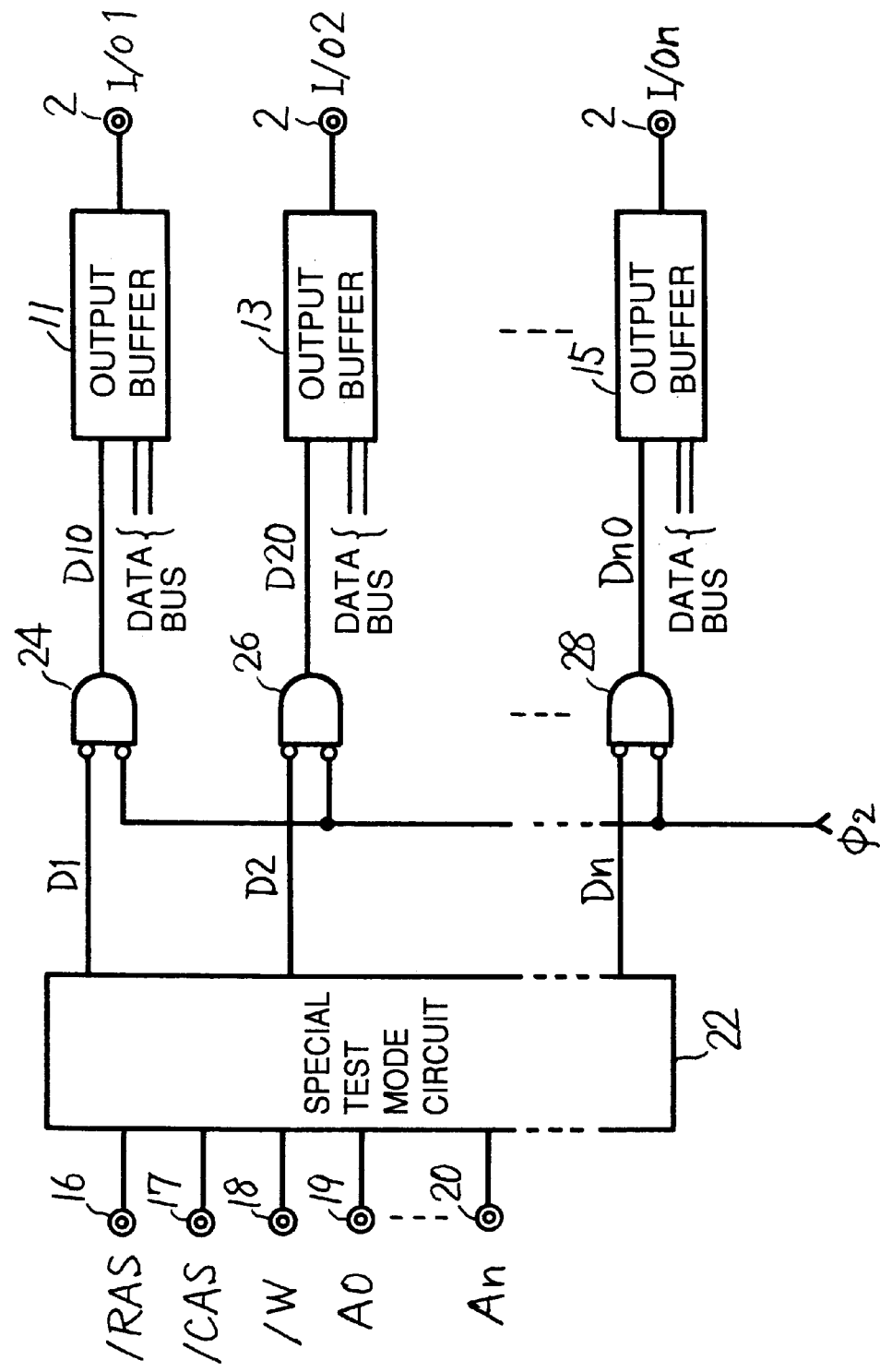
FIG. 1 shows a concept of best mode for implementing the present invention.

The semiconductor memory device in accordance with the present invention will be described in detail with reference to the figures. In the figures, same reference characters denote the same or corresponding portions.

[First Embodiment]

Referring to FIG. 1, the feature of the semiconductor memory device in accordance with the present invention can be represented by a special test mode circuit 22 including input/output terminals 16 to 20, CMOSNOR circuits 24, 26 and 28 connected to special test mode circuit 22, output buffers 11, 13 and 15 connected to output terminals of CMOSNOR circuits 24, 26 and 28, and I/O terminals 2 connected to output buffers 11, 13 and 15, wherein Di (i=1~n) represents an output signal from special test mode circuit 22, Dio (i=1=n) represents an output enable signal, and φ2 represents an output control signal.

Figure 2:
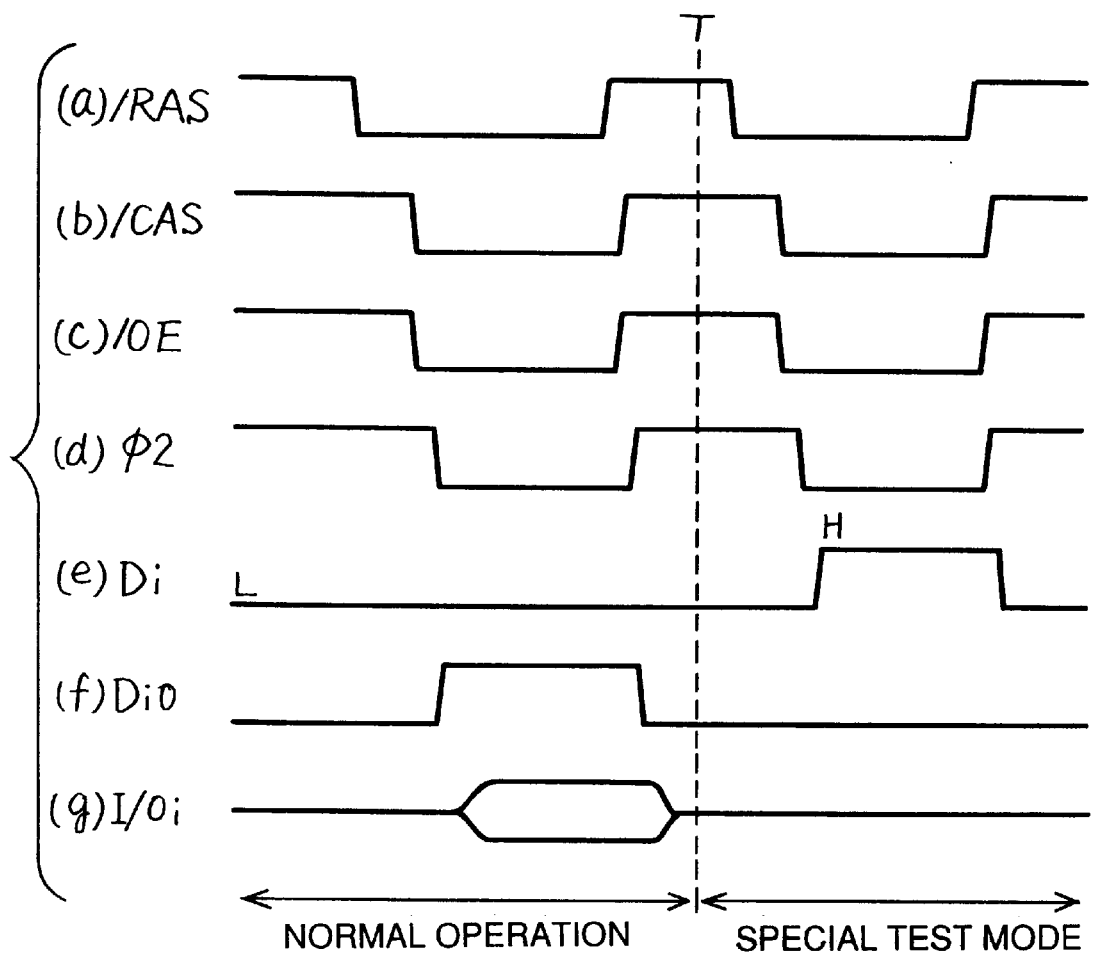
FIG. 2 is a timing chart showing an operation of the semiconductor memory device shown in FIG. 1.

The operation of the semiconductor memory device shown in FIG. 1 will be described with reference to the timing chart of FIG. 2. In normal operation, output signal Di (i=1n) is held at a GND level (hereinafter also referred to as "L" level), as shown in FIG. 2(e). Therefore, in normal operation, when output control signal φ2 which is activated and at the L level shown in FIG. 2(d) is input to CMOSNOR circuits 24, 26 and 28 (normal reading), output buffers 11, 13 and 15 are activated and data is output from every I/O terminal 2.

Next, different from the normal operation., when the semiconductor memory device enters a mode for evaluating characteristic of itself (hereinafter also referred to as "special test modes"), output signal Di (i=1~n) of special test mode circuit 22 makes a transition from L level to H level as shown in FIG. 2(e). In this case, an output enable signal Dio (i=1~n) is output without fail from CMOSNOR circuits 24, 26, and 28 as shown in FIG. 2(f) and, even if output control signal φ2 is activated to L level, output buffers 11, 13 and 15 are not activated, so that data is not output from I/O terminal 2, as shown in FIG. 2(g). Here, however, by activating an arbitrary Di among output signals Di (i=1~n) to the L level in the special test mode, it is possible to activate only the corresponding output buffer and to have only the corresponding I/O terminal 2 output data.

More specifically, the present invention attains an effect that I/O terminal dependency of noise characteristic at the time of data output can be evaluated, as data can be output from only an arbitrary I/O terminal in the special test mode.

Figure 3:
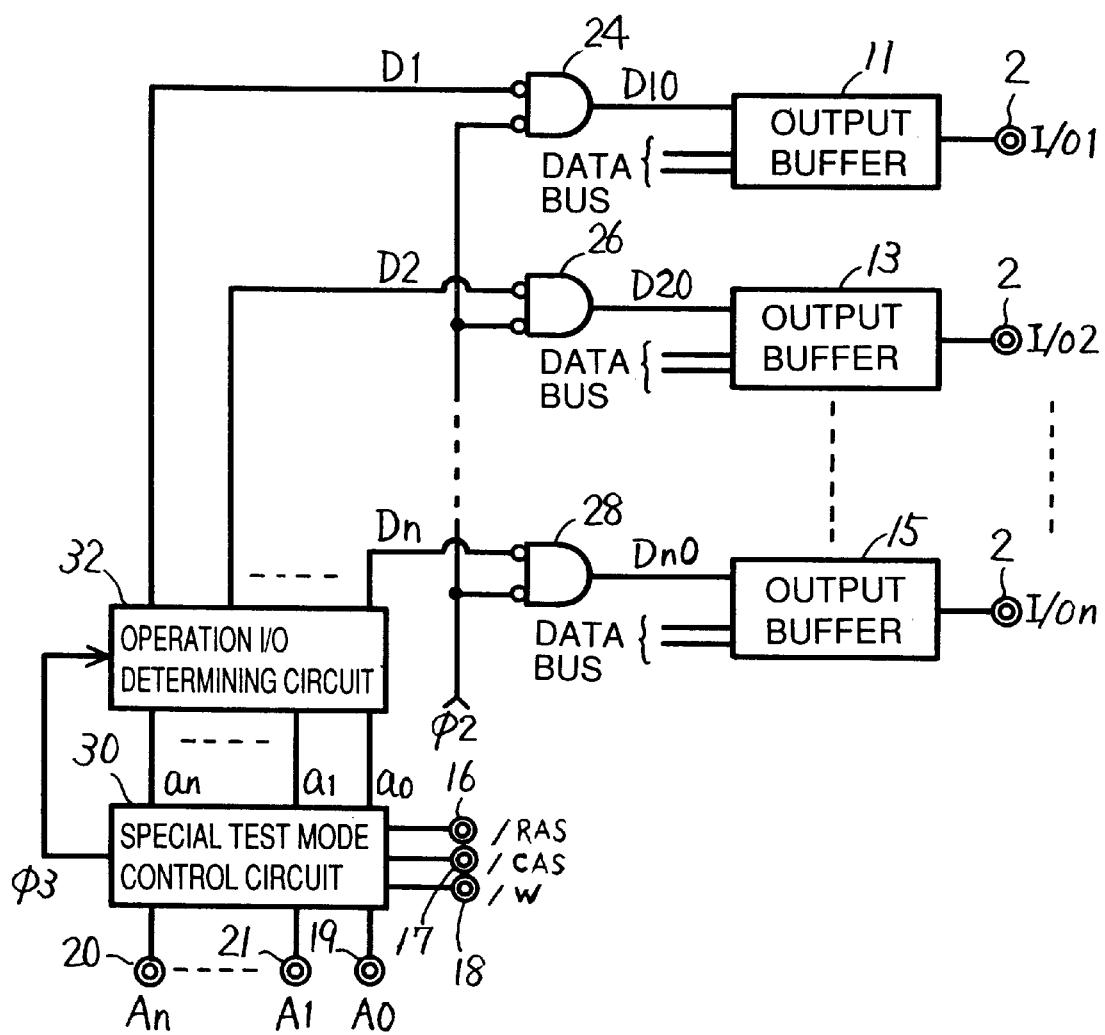
FIG. 3 shows a configuration of the semiconductor memory device in accordance with a first embodiment of the present invention.

FIG. 3 shows a specific configuration of the semiconductor memory device in accordance with the first embodiment of the present invention. Referring to FIG. 3, the semiconductor memory device includes a special test mode control circuit 30 including input terminals 16 to 21, an operation I/O determining circuit 32 connected to special test mode control circuit 30, CMOSNOR circuits 24, 26 and 28 connected to operation I/O determining circuit 32, output buffers 11, 13 and 15 connected in one to one correspondence to output terminals of CMOSNOR circuits 24, 26 and 28, respectively, and I/O terminals 2 connected in one to one correspondence to output buffers 11, 13 and 15, respectively.

Here, Dio (i=1~n) represents an output enable signal, Di (i=1 n) represents an output signal from operation I/O determining circuit 32, φ2 represents an output control signal, and φ3 represents a special test mode entry signal.

Figure 4:
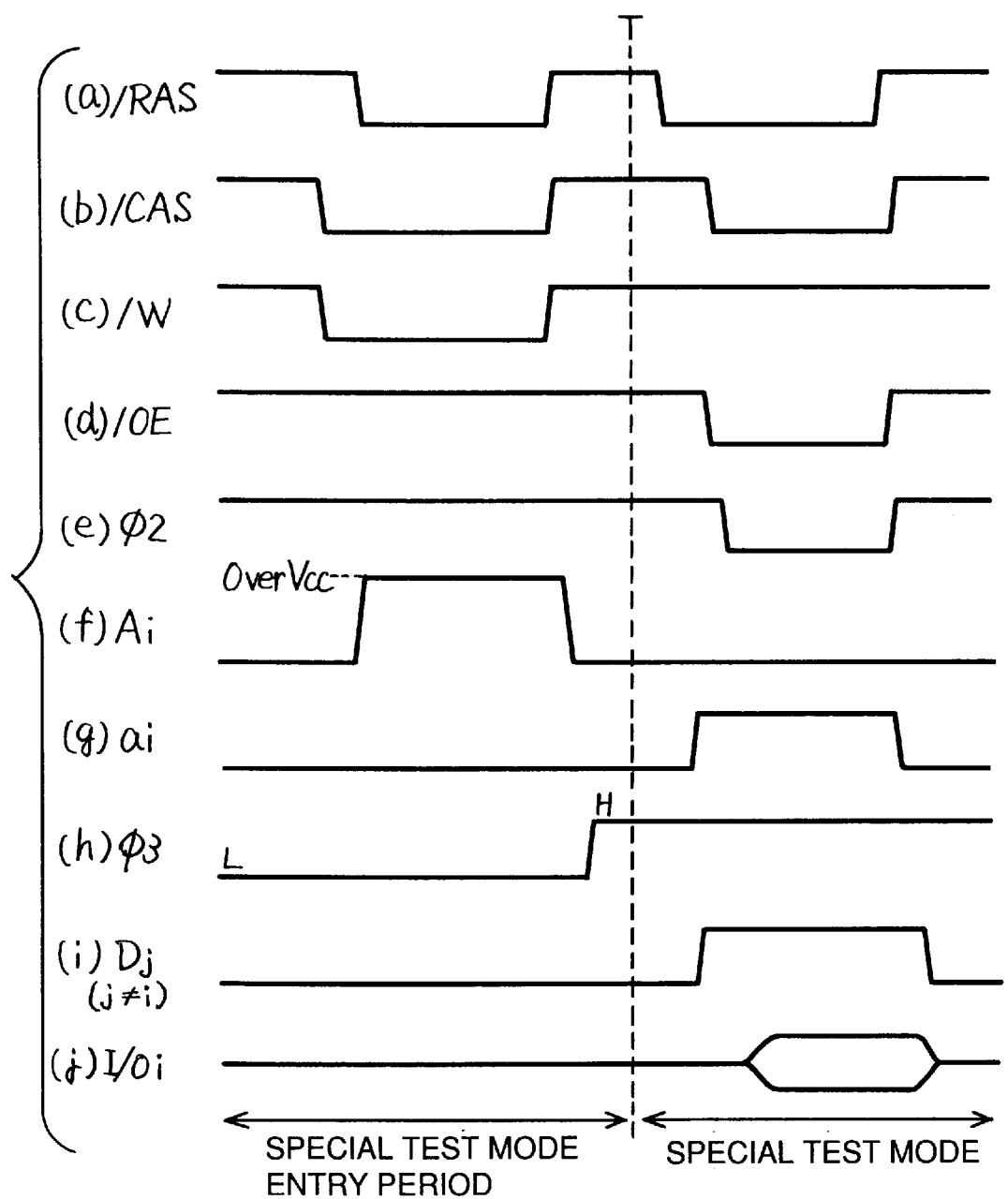
FIG. 4 is a timing chart showing an operation of the semiconductor memory device shown in FIG. 3.

The operation of the semiconductor memory device in accordance with the first embodiment will be described with reference to the timing chart of FIG. 4. In FIG. 4 and the following, the special test mode entry period represents a time period from switching of the semiconductor memory device from the normal operation mode to the special test mode until a time point T.

In the special test mode period, as shown in FIG. 4(h), special test mode entry signal φ3 output from special test mode control circuit 30 attains to the L level. In this case, operation I/O determining circuit 32 does not operate and output signals Di (i=1~n) all attain to the L level, as shown in FIG. 4(i). When output signals Di (i 32 1~n) are all at the L level, all output buffers 11, 13 and 15 are activated, and therefore it is possible for all I/O terminals 2 to output data.

By contrast, referring to (a), (b) and (c) of FIG.. 4, when a write enable signal /W and a column address strobe signal /CAS input to special test mode control circuit 30 are activated to the L level before activation to the L level of a row address strobe signal /RAS which is also input to special test mode control circuit 30 (hereinafter also referred to as "WCBR"), the semiconductor memory device enters the special test mode. In the special test mode, special test mode entry signal φ3 output from special test mode control circuit 30 attains to the H level as shown in FIG. 4(h) and operation I/O determining circuit 32 operates. Operation I/O determining circuit 32 sets an arbitrary output signal Di from L level to H level. Here, that CMOSNOR circuit which takes in the H level output signal Di outputs the output enable signal Dio at the L level without fail, and therefore the output buffer which received the L level output enable signal Dio is set to an output disable state.

In other words, data is output from the I/O terminal 2 which corresponds to the L level output signal Di.

In the following, the method by which special test mode control circuit 30 and operation I/O determining circuit 32 select an output buffer to be activated, will be described.

First, special test mode control circuit 30 detects an input level of an address signal Ai (i=0~n) input to input terminals 19 to 21 at the WCBR timing.

When it is detected that the input level of address signal Ai is sufficiently higher than $V_{1Hmax}$ (hereinafter also referred to as "OverVcc") as shown in FIG. 4(f), an H level signal ai is output to operation I/O determining circuit 32 as shown in FIG. 4(g). In this manner, oepration I/O determining circuit 32 determines an output buffer to be operated based on the combination of the signals ai having the H level, sets only the corresponding output signal Di to the L level and, as shown in FIG. 4(i), and sets other output signals Dj (j≠i) to the H level. When the input level of address signal Ai is lower than Over Vcc, the signal ai is set to L level.

As described above, the semiconductor memory device in accordance with the first embodiment of the present invention has such a configuration that allows selection of I/O terminal 2 to be operated in the special test mode dependent on combination of input levels of address signals Ai input to input terminals 19 to 21 and the special test mode is entered, and therefore data can be output from an arbitrary I/O terminal 2, and hence the present invention is effective in that I/O terminal dependency of noise characteristic at the time of data output can be evaluated.

[Second Embodiment]

Figure 5:
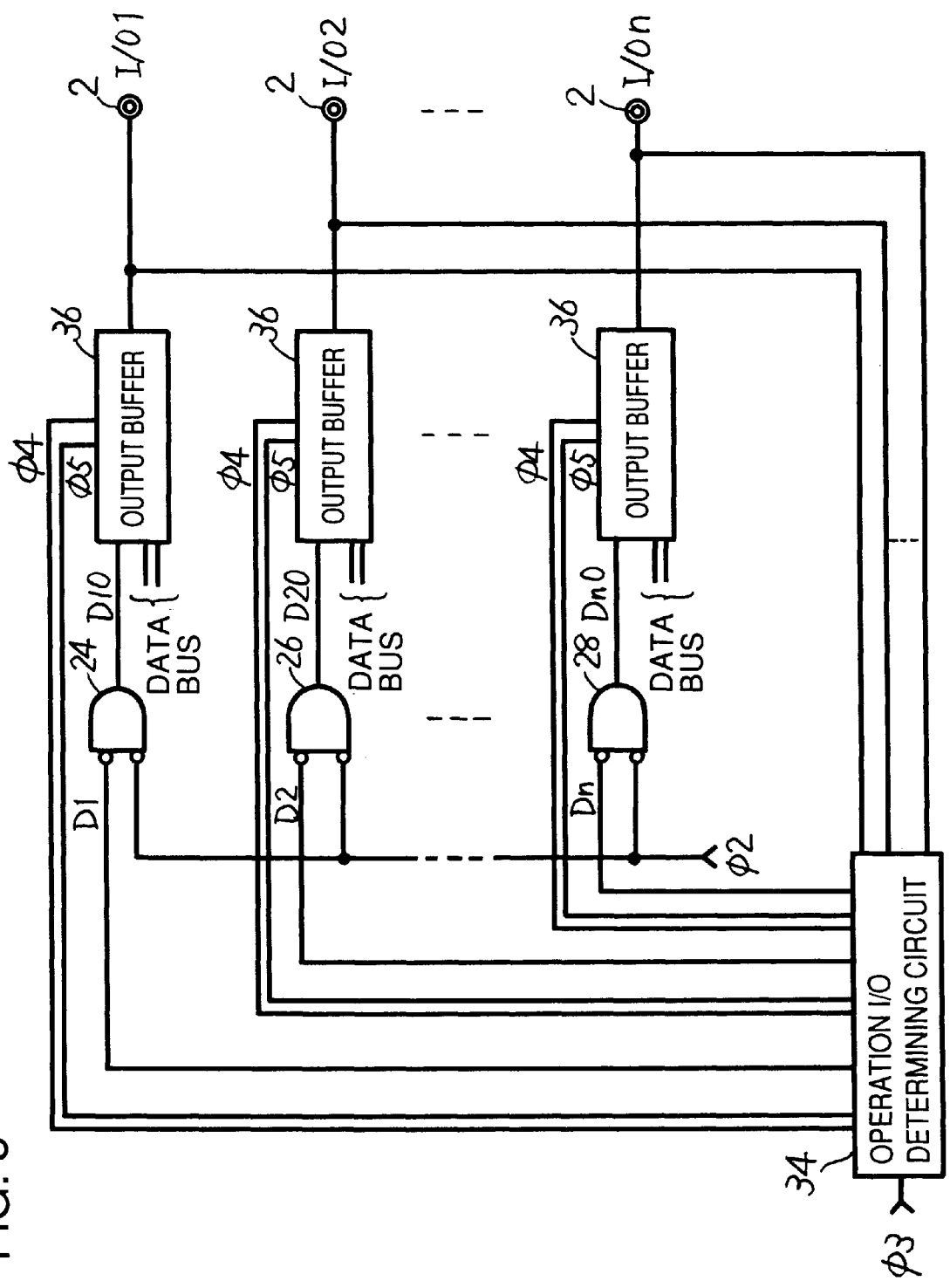
FIG. 5 shows a configuration of a semiconductor memory device in accordance with a second embodiment of the present invention.

The semiconductor memory device in accordance with the second embodiment of the present invention has the normal operation mode and the special test mode similar to the semiconductor memory device in :accordance with the first embodiment described above, and it includes, as shown in FIG. 5, I/O terminals 2, an operation I/O determining circuit 34 connected to I/O terminals 2, CMOSNOR circuits 24, 26 and 28 connected to operation I/O determining circuit 34, and output buffers 36 connected in one to one correspondence to CMOSNOR circuits 24, 26, and 28, respectively. In FIG. 5, φ3 represents the special test mode entry signal, Di (i=1~n) represents an output signal from operation I/O determining circuit 34, φ2 represents an output control signal, Dio (i =1~n) represents an output enable signal, and φ4 and φ5 represent signals for changing size of output transistors.

Figure 6:
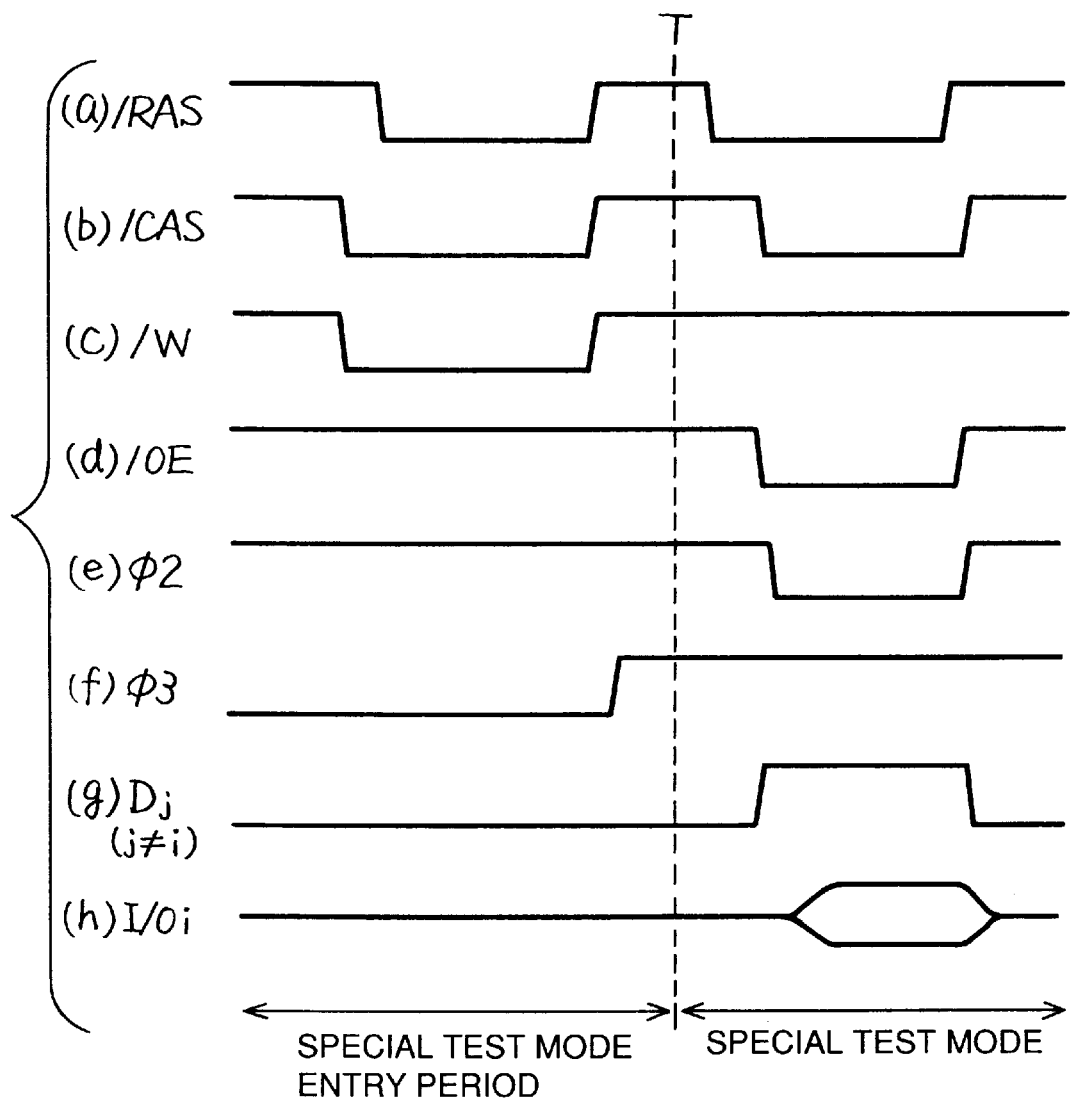
FIG. 6 is a timing chart showing an operation of the semiconductor memory device shown in FIG. 5.

In the following, the operation of the semiconductor memory device in accordance with the second embodiment of the present invention will be described with reference to the timing chart of FIG. 6.

In the special test mode entry period for entering the special test mode, the special test mode entry signal φ3 at the L level shown in FIG. 6(f) is input to operation I/O determining circuit 34, and therefore operation I/O determining circuit 34 does not operate, and the output signals Di (i=1~n) thereof all attain to the L level. Therefore, data output is controlled by output control signal φ2, and when output control signal φ2 is activated to the L level, all output buffers 36 are activated and data are output simultaneously from all I/O terminals 2.

By contrast, when the special test mode is entered, a control circuit (not shown) similar to the special test mode control circuit 30 shown in FIG. 3 provides the special test mode entry signal φ3 at the H level to operation I/O determining circuit 34 as shown in FIG. 6(f), and operation I/O determining circuit 34 operates.

Operation I/O determining circuit 34 detects a signal level input to the I/O terminal 2 at the time of entrance to the special test mode, and selects the I/O terminal 2 from which data is to be output.

When data I/Oi input to I/O terminal 2 at the WCBR timing only is at the H level and other data I/O2 to I/On are all at the L level, then the output signal Di at the L level and the output signals Dj (j≠i) at the H level shown in FIG. 6(g) are output from operation I/O determining circuit 34, and only the data I/Oi shown in FIG. 6(h) is output from I/O terminal 2. In this case, it is also possible to output data simultaneously from an arbitrary number of I/O terminals 2.

As described above, in the semiconductor memory device described above, dependent on the level of data input to I/O terminals 2 when the special test mode is entered, it is possible to select an I/O terminal 2 to be operated in the special test mode. Therefore, the invention provides an effect that I/O terminal dependency of noise characteristic at the time of data output can be evaluated.

Figure 7:
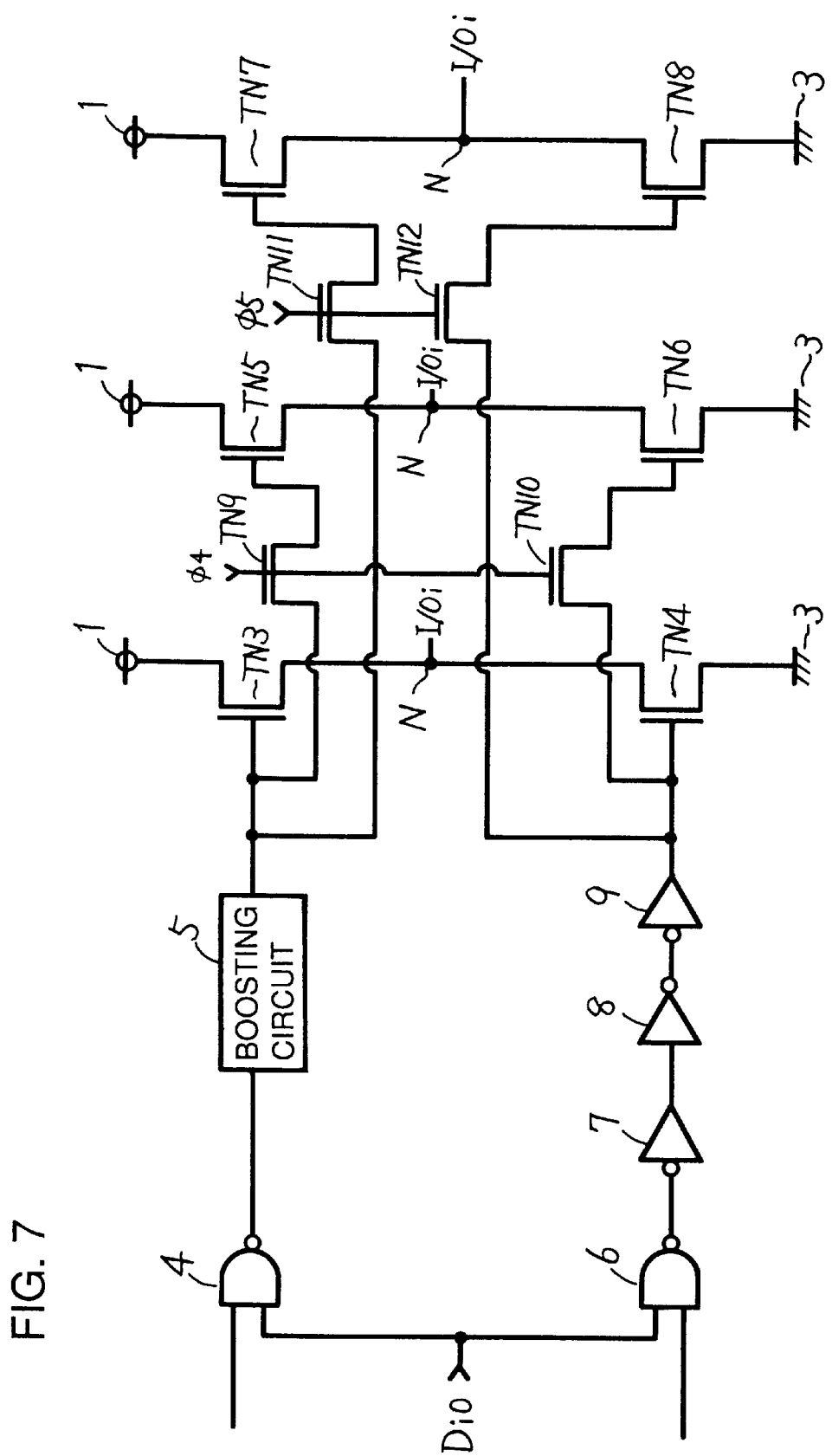
FIG. 7 is a diagram of circuit configuration of an output buffer shown in FIG. 5.

Specific configuration of output buffer 36 is shown in FIG. 7. Referring to FIG. 7, output buffer 36 includes CMOSNAND circuits 4 and 6, CMOS inverters 7, 8 and 9, a boosting circuit 5, NMOS transistors TN3 to TN12, power supply nodes 1, ground nodes 3, output nodes N and, though not shown in the figure, the output nodes N are connected to the same I/O terminal.

Figure 8:
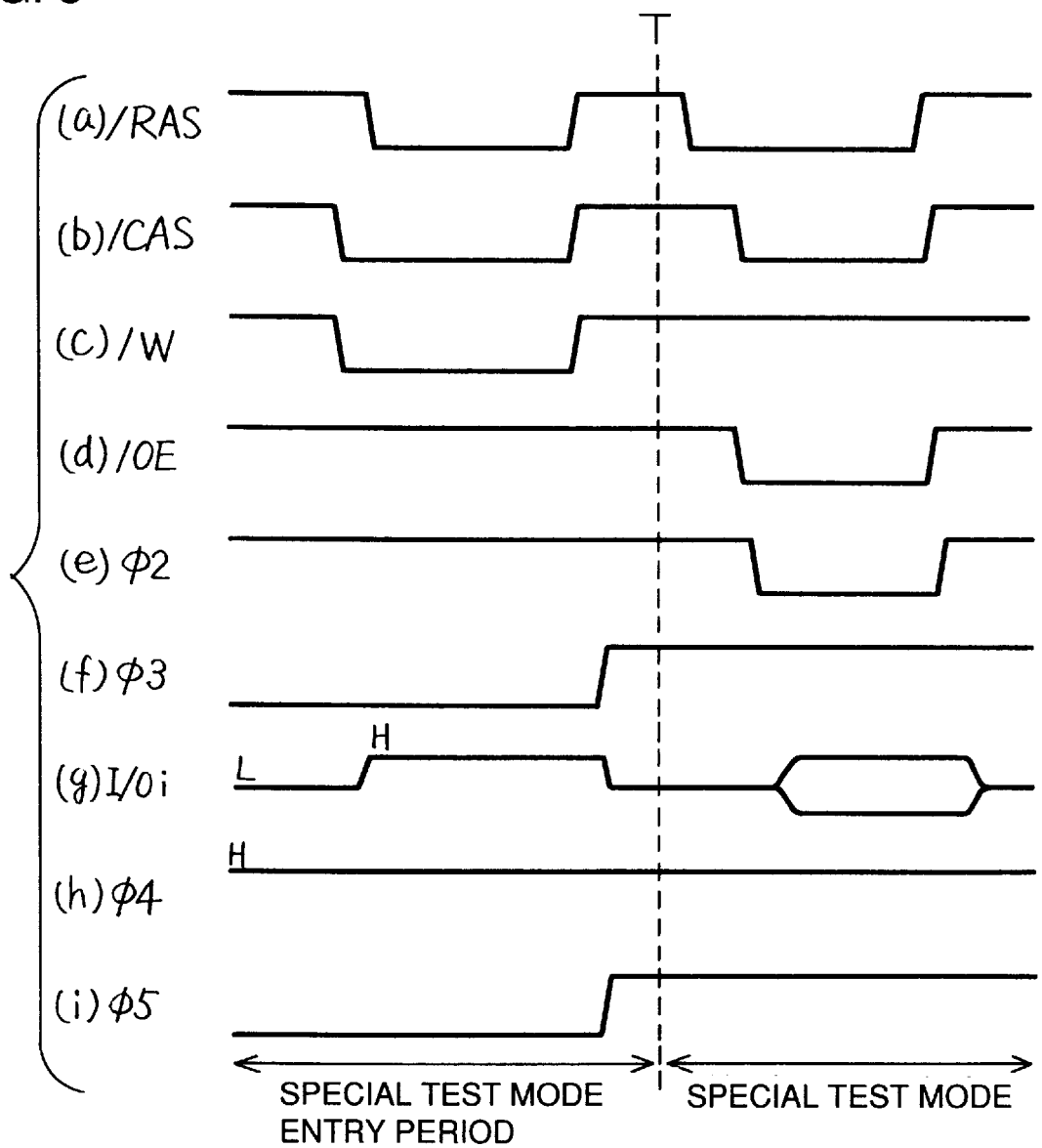
FIG. 8 is a timing chart showing an operation of the output buffer shown in FIG. 7.

The operation of the output buffer will be described with reference to the timing chart of FIG. 8.

In the special test mode entry period, the signal φ4 output from operation I/O determining circuit 34 is always kept at the H (boosted) level, as shown in FIG. 8(h). Therefore, NMOS transistors TN9 and TN10 are turned on, and output buffer 36 comes to be configured by two output stages consisting of NMOS transistors TN3 to TN6.

In the special test mode, in addition to the signal φ4, the signal φ5 output from operation I/O determining circuit 341 attains to the H (boosted) level as shown in FIG. 8(i), so that NMOS transistors TN11 and TN12 additionally turn on, and output buffer 36 comes to be configured by three output stages consisting of NMOS transistors TN3 to TN8. Accordingly, the so-called size of the output transistors is increased.

When the signal φ4 attains to the L level, the output buffer 36 comes to be configured by one output stage consisting of NMOS transistors TN3 and TN4, and therefore the size of the output transistors is reduced.

In this manner, by controlling signals φ4 and φ5 output from operation I/O determining circuit 32, it is possible to change the size of the output transistors included in output buffer 36. Here, signals φ4 and φ5 are controlled by detecting levels of data input to I/O terminals when the special test mode is entered. When the input level of data I/Oi is at the H level when the special test mode is entered as shown in FIG. 8(g), for example, then in response, the level of the signal φ5 shown in FIG. 8(i) is changed to H, and the size of the output transistors in the special test mode is changed. This enables change in the amount of current at the time of data output.

As described above, in the semiconductor memory device in accordance with the second embodiment of the present invention, when an arbitrary I/O terminal is selectively operated in the special test mode, the size of the output transistors can be changed simultaneously. Therefore the present invention provides an effect that both I/O terminal dependency and output current dependency of noise characteristic at the time of data output can be evaluated.

[Third Embodiment]

Figure 9:
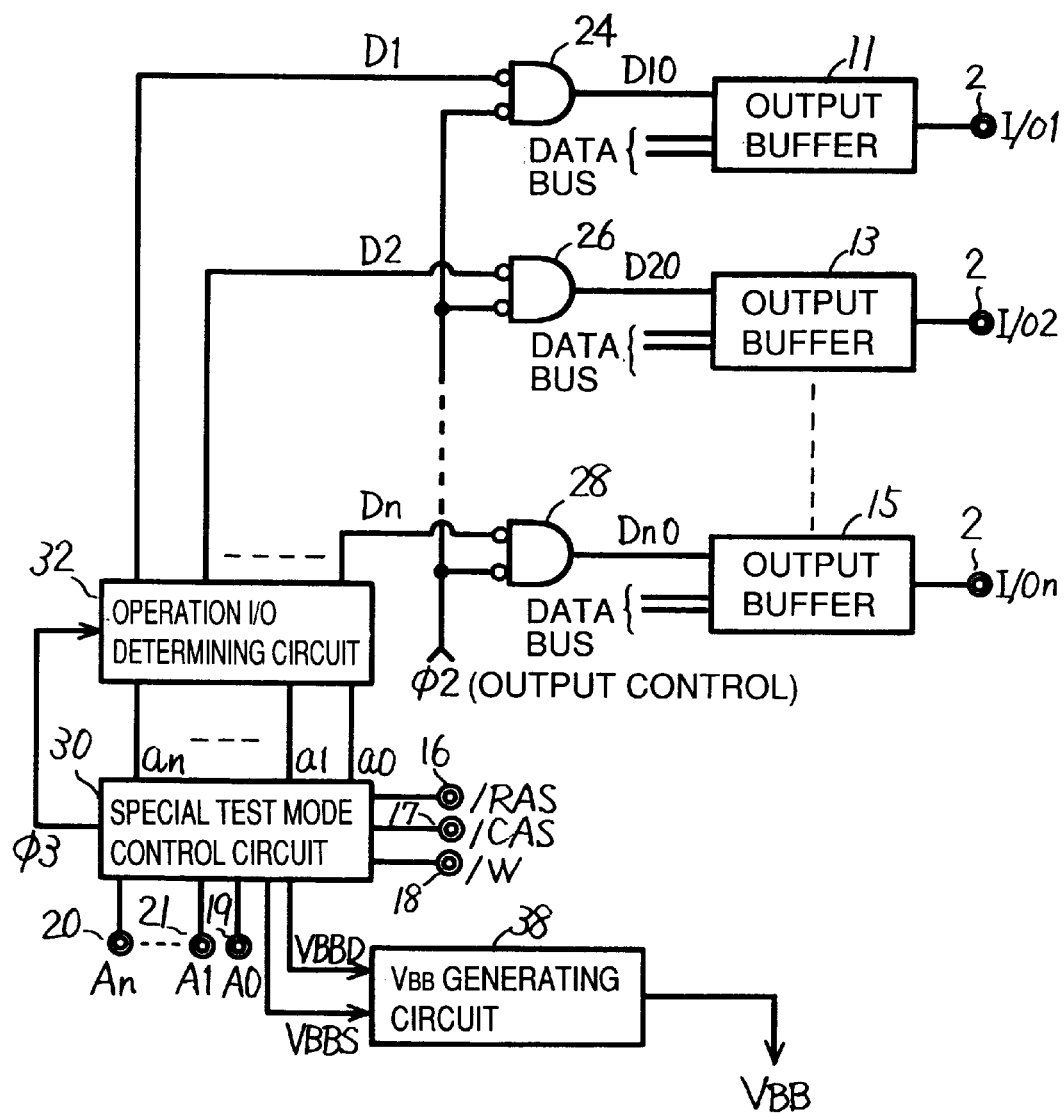
FIG. 9 shows a configuration of a semiconductor memory device in accordance with a third embodiment of the present invention.
Figure 10:
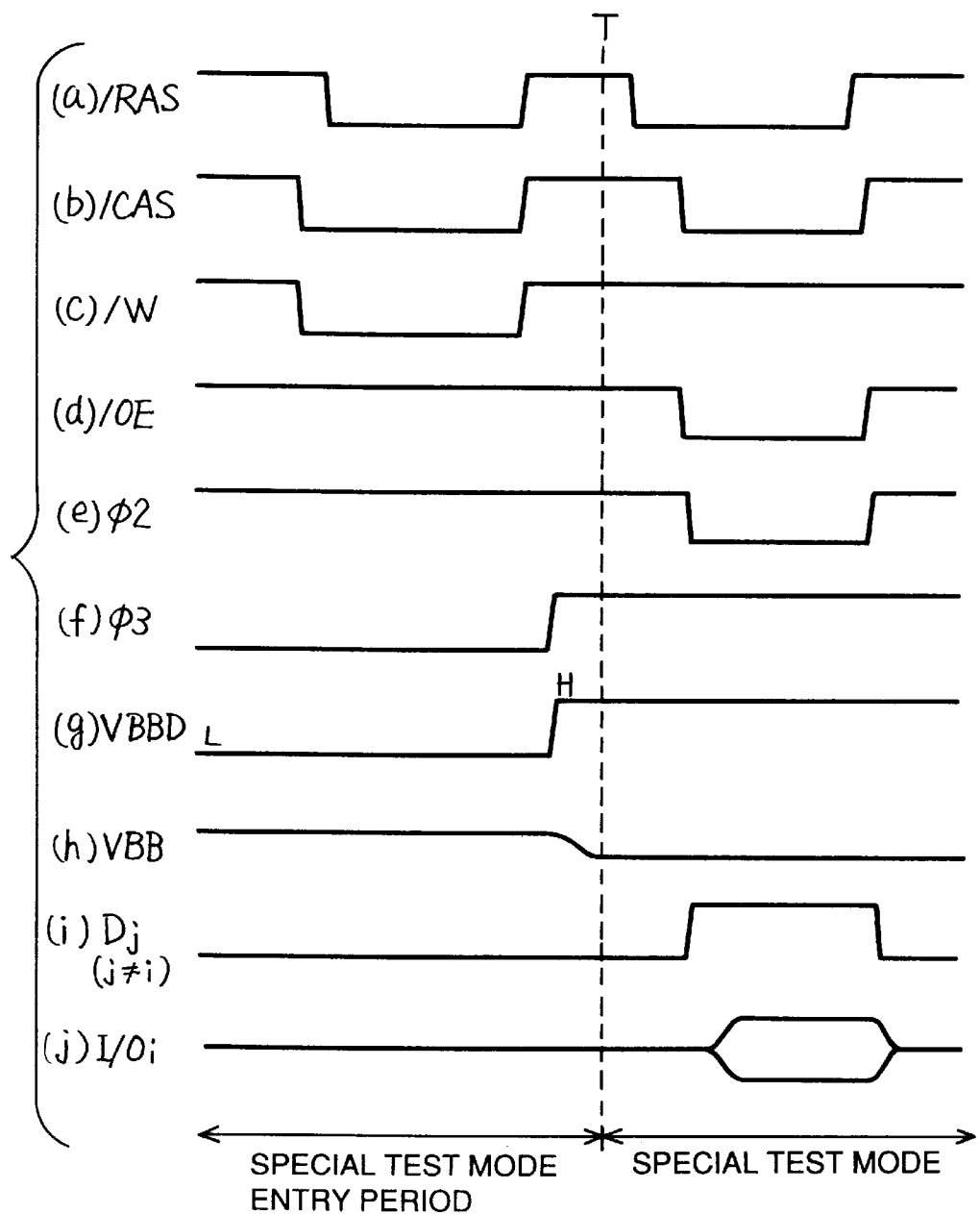
FIG. 10 is a timing chart showing an operation of the semiconductor memory device shown in FIG. 9.
Figure 11:
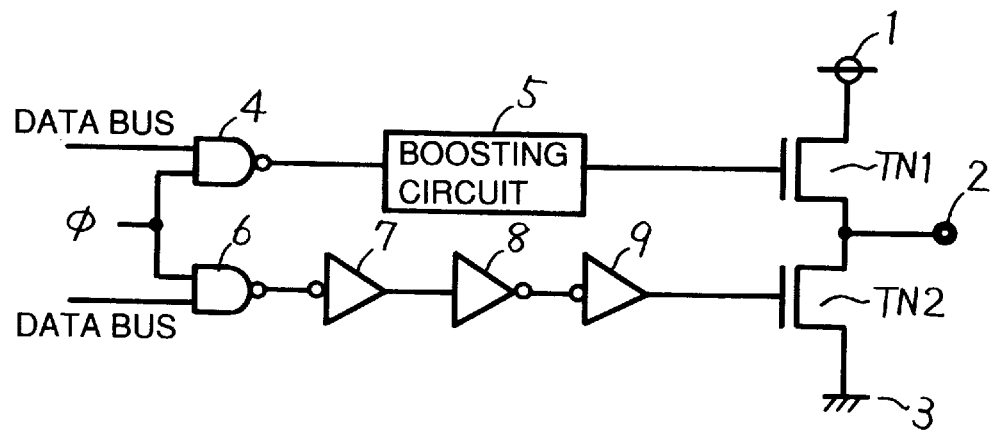
FIG. 11 shows a configuration of an output buffer in a conventional semiconductor memory device.
Figure 12:
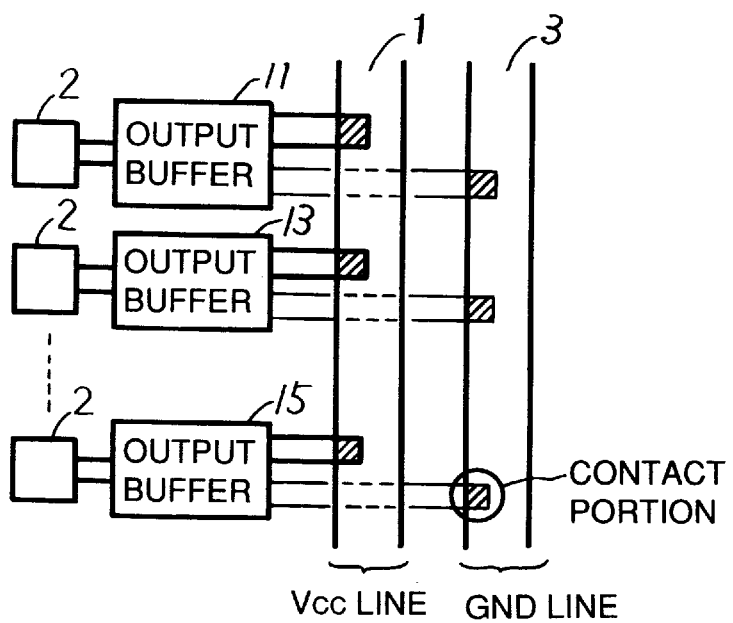
FIG. 12 shows a pattern layout of output buffers in the conventional semiconductor memory device.

A semiconductor memory device in accordance with the third embodiment of the present invention shown in FIG. 9 has a configuration similar to the semiconductor memory device in accordance with the first embodiment shown in FIG. 3, except that a $V_{BB}$ generating circuit 38 is additionally provided. In FIG. 9, $V_{BB}$ represents a substrate voltage. VBBD and VBS are signals generated in special test mode control circuit 30, which are control signals supplied for increasing (making deeper the level of substrate voltage $V_{BB}$) and lowering (making shallower the level of the substrate voltage $V_{BB}$) of the capability of $V_{BB}$ generating circuit 38, respectively. The operation of the semiconductor memory device in accordance with the third embodiment will be described with reference to the timing chart of FIG. 10.

First, in the special test mode entry period, special test mode entry signal φ3 is at the L level as shown in FIG. 10(f), and operation I/O determining circuit 32 does not operate. Output signals Di (i=1~n) output from operation I/O determining circuit 32 are all at the L level. Therefore, in the normal operation, data output from I/O terminal 2 is controlled by output control signal φ2.

The special test mode which takes place when the row address strobe signal /RAS, column address strobe signal /CAS and write enable signal /W are input at the WCBR timing to special test mode control circuit 30 will be described in the following.

The operation in the special test mode is similar to that in the semiconductor memory device in accordance with the first embodiment described above. Here, referring to FIG. 10(g), control signal VBBD attains from L level to H level, and the level of substrate voltage $V_{BB}$ lowers (made deep) as shown in FIG. 10(h).

Though not shown, it is also possible to increase (make shallow) the level of substrate voltage $V_{BB}$ by changing control signal VBBS from L level to H level when the special test mode is entered.

Therefore, the semiconductor memory device in accordance with the third embodiment allows selective operation of an arbitrary I/O terminal 2 and, at the same time, changing of the level of substrate voltage $V_{BB}$.

The noise characteristic at the time of data output changes as the amount of current at the time of output changes. Accordingly, by changing the level of substrate voltage $V_{BB}$ at the time of data output, characteristics of output transistors constituting output buffers 11, 13 and 15 are changed, and hence the amount of current at the time of output is changed. When the level of substrate voltage $V_{BB}$ is lowered to increase substrate effect, for example, the amount of current flowing through the output transistors is reduced, and therefore it is possible to reduce noise at the time of data output.

As described above, the semiconductor memory device in accordance with the third embodiment of the present invention has such a configuration that allows selective operation of an arbitrary I/O terminal 2 simultaneously with changing of capability of $V_{BB}$ generating circuit 38 in the special test mode. Therefore, the present invention has an effect that I/O terminal dependency and output current dependency of noise characteristic at the data output can be evaluated.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a normal operation mode and a test mode, comprising:

a plurality of input/output terminals;

a data bus;

a plurality of output buffers, provided for said plurality of input/output terminals respectively, for driving potential levels of said plurality of input/output terminals according to data transmitted through said data bus during said normal operation mode and selectively activated to drive the potential levels of said plurality of input/output terminals during said test mode;

a selecting circuit for selecting and activating output buffers out of said plurality of output buffers in said test mode, wherein said selecting circuit selects an output buffer to be activated among said plurality of output buffers in response to signals supplied to said input/output terminals when operation enters from the normal operation mode to said test mode, and the number of said activated output buffers is smaller than that of said plurality of output buffers.

2. The semiconductor memory device according to claim 1, further comprising substrate voltage supplying circuit for supplying a substrate voltage; and substrate voltage control circuit controlling said substrate voltage supplying means such that the substrate voltage different in magnitude from said normal operation mode is supplied in said test mode.

3. A semiconductor memory device having a normal operation mode and a test mode, comprising:

a plurality of input/output terminals;

a data bus;

a plurality of output buffers, provided for said plurality of input/output terminals respectively, for driving potential levels of said plurality of input/output terminals according to data transmitted through said data bus during said normal operation mode and selectively activated to drive the potential levels of said plurality of input/output terminals during said test mode;

a selecting circuit for selecting and activating only one output buffers of said plurality of output buffers in said test mode, wherein said selecting circuit selects an output buffer to be activated among said plurality of output buffers in response to signals supplied to said input/output terminals when operation enters from the normal operation mode to said test mode.

4. The semiconductor memory device according to claim 3, further comprising substrate voltage supplying circuit for supplying a substrate voltage; and substrate voltage control circuit controlling said substrate voltage supplying means such that the substrate voltage different in magnitude from said normal operation mode is supplied in said test mode.

* * * * *